(12) United States Patent
Gao et al.

(10) Patent No.: US 6,686,665 B1
(45) Date of Patent: Feb. 3, 2004

(54) SOLDER PAD STRUCTURE FOR LOW TEMPERATURE CO-FIRED CERAMIC PACKAGE AND METHOD FOR MAKING THE SAME

(75) Inventors: Guilian Gao, San Jose, CA (US); David John Lewis, Campbell, CA (US); Stephen Thomas Murphy, Rio Vista, CA (US)

(73) Assignee: Zeevo, Inc., Santa Clara, CA (US)

( * ) Notice: Subject to any disclaimer, the term of this patent is extended or adjusted under 35 U.S.C. 154(b) by 0 days.

(21) Appl. No.: 10/235,762

(22) Filed: Sep. 4, 2002

(51) Int. Cl.[7] ............... H01L 23/48; H01L 23/52; H01L 29/40
(52) U.S. Cl. ............... 257/781; 257/780; 438/612
(58) Field of Search .................. 257/780, 781, 257/777; 438/613, 108, 612, 617; 287/778, 779, 783

(56) References Cited

U.S. PATENT DOCUMENTS

| | | | | |
|---|---|---|---|---|
| 4,742,023 | A | * | 5/1988 | Hasegawa |
| 5,036,383 | A | * | 7/1991 | Mori |
| 6,404,051 | B1 | * | 6/2002 | Ezawa et al. |
| 6,434,017 | B1 | * | 8/2002 | Iwabuchi |
| 6,462,425 | B1 | * | 10/2002 | Iwasaki et al. |
| 6,479,900 | B1 | * | 11/2002 | Shinogi et al. |

OTHER PUBLICATIONS

Author: Unknown, Title: *"DuPont Green Tape™ Design and Layout Guideline,"* Date: Unknown, Place: found on the World Wide Web at http://www.dupont.com/mcm/gtapesys/part1.html.

Author: Horne et al., Title: *"Silver and Mixed Metal Solution for LTCC Applications,"* Date: Unknown, Place:DuPont Electronic Materials, Research Triangle Park, North Carolina.

Author: Unknown, Title: *"Design Rules for Physical Layout of Low Temperature Co–Fired Ceramic Modules,"* Date: Jan. 5, 2000, Place: National Semiconductor Corporation, Unpublished Work, Version 8.1.

* cited by examiner

*Primary Examiner*—Sheila V. Clark
(74) *Attorney, Agent, or Firm*—Martine & Penilla, LLP

(57) ABSTRACT

A package for semiconductor devices, and methods for making the same are provided. The package includes a low temperature co-fired ceramic body that has a plurality of conductive interconnect layers. The low temperature co-fired ceramic body includes at least one solder ball attach side. A plurality of solder ball attach pads are defined on the solder ball attach side(s) of the low temperature co-fired ceramic body. Each of the solder ball attach pads is in contact with a conductive via that is in electrical communication with at least one of the plurality of conductive interconnect layers, and each solder ball attach pad has metallic content that is limited to silver.

33 Claims, 12 Drawing Sheets

US 6,686,665 B1

SOLDER PAD STRUCTURE FOR LOW TEMPERATURE CO-FIRED CERAMIC PACKAGE AND METHOD FOR MAKING THE SAME

BACKGROUND OF THE INVENTION

1. Field of the Invention

The present invention relates generally to integrated circuit device packaging, and more particularly, to apparatuses and methods for improved bonding of solder balls to package structures.

2. Description of the Related Art

Typically, integrated circuit devices include multi-level structures contained within a substrate material. The multi-level structures can include passive components connected by metallization lines. In the field of radio frequency (RF) and wireless applications, use of Low Temperature Co-Fired Ceramic (LTCC) substrates are becoming more popular for defining multi-level structures having passive components connected by metallization lines. LTCC substrates are capable of embedding passive components while providing superior performance at high frequencies. In this manner, LTCC substrates are generally attached to a printed circuit board (PCB), a number of semiconductor devices, or a number of discrete components, or a combination thereof, to define a larger electronic device. The LTCC substrates are commonly attached to the PCB using a ball grid array (BGA) attachment technique. Attachment of the semiconductor devices to the LTCC substrate can be accomplished by flip chip or wire bonding.

FIG. 1A shows an illustration of a BGA-to-PCB attachment configuration 100, in accordance with the prior art. In the BGA-to-PCB attachment configuration 100, an LTCC substrate 101 is attached to a PCB 102 using a number of electrically conductive balls 111. Each of the balls 111 are disposed between a LTCC ball attachment pad 105 and a PCB ball attachment pad 106. Solder 108 is used to mechanically and electrically attach each of the balls 111 to both the LTCC ball attachment pad 105 and the PCB ball attachment pad 106.

FIG. 1B shows an illustration of a flip chip attachment configuration 120, in accordance with the prior art. A semiconductor device 121 is attached to the LTCC substrate 101 using a number of electrically conductive balls 127. Each of the balls 127 are disposed between an LTCC via (not shown) or an LTCC ball attachment pad 125 and a semiconductor under bump metallurgy (UBM) pad 123. The ball 127 can be pre-deposited onto the semiconductor UBM pad 123, the LTCC via, or the LTCC ball attachment pad 125. A solder reflow process is used to form joints between the semiconductor device 121, the LTCC substrate 101, and the balls 127. A fluxing agent is often used to aid joint formation during the solder reflow process.

In certain applications where device cost is secondary (e.g., military applications), gold (Au) conducting material is used within the LTCC substrate to fabricate the chip. However, in commercial applications where competition is a motivating factor for reducing cost, it is generally more desirable to use less expensive silver (Ag) conducting material within the LTCC substrate. Unfortunately, use of Ag conducting material within the LTCC substrate introduces material compatibility and component interface issues when using the BGA attachment technique. Specifically, use of Ag conducting material has traditionally required the use of a palladium (Pd)/Ag material mixture as the LTCC ball attachment pad 105. The Pd/Ag LTCC ball attachment pad 105 adhesion characteristics are adversely affected by reaction with solder materials during a typical device fabrication process. Consequently, the Pd/Ag LTCC ball attachment pad 105 is prone to delaminate from the LTCC substrate 101 resulting in BGA attachment failure during either fabrication or subsequent use of the device. Such BGA attachment failure causes product reliability to be unacceptably poor.

FIG. 1C shows an illustration of the BGA-to-PCB attachment configuration 100 with respect to the LTCC substrate 101, in accordance with the prior art. The LTCC ball attachment pad 105 in disposed above a via 103 in the LTCC substrate 101. The via 103 is a Ag or Ag/Pd conductor configured to electrically connect the Ag metallization lines (not shown) within the LTCC substrate 101 with the ball 111. In the prior art, the LTCC ball attachment pad 105 is composed of 20% Pd and 80% Ag. It has been traditionally assumed that the Pd enhances the resistance of the LTCC ball attachment pad 105 to leaching by the solder 108, wherein the solder 108 is composed of either a 96.5% tin (Sn) and 3.5% Ag mixture or a 63% Sn and 37% lead (Pb) mixture. It has been further assumed that the Pd inhibits Ag migration when exposed to a voltage bias. Also, the prior art suggests using a lower Pd content Pd/Ag mixture as a transition layer between the Ag via 103 and the Pd/Ag solder pad. The difficulty with using Pd/Ag for the LTCC ball attachment pad 105 as suggested by the prior art becomes apparent during fabrication when successive reflow operations are performed.

FIG. 1D shows an illustration of the BGA-to-PCB attachment configuration 100 with respect to the LTCC substrate 101 after a reflow operation, in accordance with the prior art. During the reflow operation, the Sn in the solder 108 diffuses toward the LTCC substrate 101. Correspondingly, the Ag/Pd material of the LTCC ball attachment pad 105 is displaced toward the ball 111. As a result of the Sn diffusion, a Sn diffusion layer forms within the LTCC ball attachment pad 105 and extends to the surface adjacent to the LTCC substrate 101. After successive reflow operations, the Sn diffusion layer can be composed of more than 50% Sn. Such a high percentage of Sn indicates a significant consumption of the LTCC ball attachment pad 105 through leaching by the solder 108. Thus, the presence of Pd in the LTCC ball attachment pad 105 does not provide enhanced resistance to leaching by the solder 108, as suggested by the prior art.

FIG. 1E shows an illustration of the Sn diffusion and resulting LTCC ball attachment pad 105 delamination 112 caused by the reflow operation, in accordance with the prior art. As previously discussed, the Sn contained within the solder 108 diffuses into the LTCC ball attachment pad 105 causing a displacement of the Pd/Ag toward the ball 111. The Sn diffusion layer formed within the LTCC ball attachment pad 105 at the LTCC substrate 101 interface weakens the adhesion between the LTCC ball attachment pad 105 and LTCC substrate 101. The weakened adhesion in combination with the mechanical and thermal stresses induced by the reflow operation causes delamination 112 of the LTCC ball attachment pad 105 from the LTCC substrate 101. Once delamination 112 occurs, the via 103 alone is required to withstand the mechanical and thermal stresses resulting from continued fabrication and subsequent use of the device. Generally, the via 103 is not strong enough to withstand these stresses. Thus, via 103 failure (i.e., cracking) causes the electrical conductivity from the via 103 through the ball 111 to be interrupted.

FIG. 1F-1 shows a scanning electron microscope (SEM) image of the BGA-to-PCB attachment configuration 100 following a typical reflow operation sequence, in accordance with the prior art. The LTCC substrate 101 is shown to be mechanically and electrically connected to the PCB 102 by a number of balls 111.

FIG. 1F-2 shows a SEM image of the ball 111 configured between the LTCC substrate 101 and the PCB 102 following a typical reflow operation sequence, in accordance with the prior art. The delamination 112 is visible on each side of the via 103 between the LTCC substrate 101 and the PCB 102.

FIG. 1F-3 shows a SEM image of the LTCC ball attachment pad 105 interface with the LTCC substrate 101 following a typical reflow operation sequence, in accordance with the prior art. The delamination 112 is clearly visible on each side of the via 103. Also, via failure 113 is visible at a location proximate to the LTCC ball attachment pad 105 interface with the LTCC substrate 101.

A prior art solution to the solder leaching, Sn diffusion, and solder pad delamination problems is to use gold (Au) or a Au containing mixture, such as Au/platinum (Pt) or Au/Ag, as the material for the LTCC ball attachment pad 105. One issue with this prior art solution is that the high cost of Au and Pt increases the overall cost of the device. Another problem is that use of a Au or Au containing material generally requires the use of a transition metal layer between the via 103 and the LTCC ball attachment pad 105. The transition metal layer is intended to limit the diffusion of Ag from the via 103 to the LTCC ball attachment pad 105. Such Ag diffusion can create voids in the via 103 resulting in an unacceptable loss of electrical conductivity. The transition metal layer is typically composed of Au/Ag or Pd/Ag. Both Au and Pd are expensive materials, thus the use of the transition metal layer increases the overall material cost of the device.

The transition metal layer can be implemented as either a buried capture cap or a post-fire cap over the via 103. Those skilled in the art generally consider the post-fire cap to be more reliable than the buried capture cap. Use of the post-fire cap, however, entails increased complexity in device fabrication. Specifically, use of the post-fire cap requires two additional firing operations. One additional firing operation is for the post-fire cap over the via 103. The other additional firing operation is for the Au or Au containing LTCC ball attachment pad 105 over the post-fire cap. Therefore, use of the Au containing LTCC ball attachment pad 105 and associated transition metal layer, as suggested by the prior art, results in an increased overall device cost due to higher material costs and increased fabrication complexity.

In view of the foregoing, there is a need for an apparatus and a method to reliably attach a BGA ball to an LTCC substrate. The apparatus and method should avoid the problems of the prior art by providing leach resistance, good adhesion, sufficient strength, simple fabrication, and overall cost effectiveness.

SUMMARY OF THE INVENTION

Broadly speaking, the present invention fills these needs by providing a ceramic package with solder ball attach pads that improve the performance of the ceramic package during manufacture and in-field use. The invention further provides a method for making a ceramic package having the improved solder ball attach pads. It should be appreciated that the present invention can be implemented in numerous ways, including as a process, an apparatus, a system, a device, or a method. Several embodiments of the present invention are described below.

In one embodiment, a semiconductor ceramic package is disclosed. The package is defined by a ceramic body that has a plurality of conductive interconnect layers. The ceramic body has at least one solder ball attach side. A plurality of solder ball attach pads are defined on the solder ball attach side(s) of the ceramic body, and each of the solder ball attach pads is in contact with a conductive via that is in electrical communication with one of the plurality of conductive interconnect layers. Each solder ball attach pad includes metal content that is limited to silver metal. In this embodiment, a plurality of glass anchors are also provided. Each glass anchor is configured to surround and overlap a periphery of each of the solder ball attach pads.

In another embodiment, a package for semiconductor devices is disclosed. The package includes a low temperature co-fired ceramic body that has a plurality of conductive interconnect layers. The low temperature co-fired ceramic body includes at least one solder ball attach side. A plurality of solder ball attach pads are defined on the solder ball attach side(s) of the low temperature co-fired ceramic body, and each of the solder ball attach pads is in contact with a conductive via that is in electrical communication with at least one of the plurality of conductive interconnect layers. In this embodiment, each solder ball attach pad has metallic content that is limited to silver.

In another embodiment, a method for making a semiconductor package is disclosed. The method includes providing a ceramic body that has a plurality of metallic interconnect layers. The ceramic body has at least one solder ball attach side and a plurality of conductive vias. The method includes screen printing a solder ball attach pad over each of the conductive vias. The solder ball attach pad is defined from metallic content that is limited to silver. A glass anchor is then formed around an outer periphery of a number of the solder ball attach pads. The glass anchor overlaps at least a portion of the outer periphery and is partially defined over the ceramic body. In this embodiment, the glass anchor provides mechanical support to offset stress fractures at an interface between the solder ball attach pads and the ceramic body.

The advantages of the present invention are numerous. Most notably, the package of the present invention uses solder ball attach pads that limit the metallic content to silver. The solder ball attach pads are used to mechanically and electrically connect solder balls (e.g., BGA solder balls) to a ceramic body (e.g., an LTCC substrate). The use of silver as the sole metallic content of the solder ball attach pads minimizes solder leaching into the solder ball attachment pad during a reflow operation, wherein the leaching can cause a delamination of the solder ball attachment pad from the LTCC substrate. Accordingly, against convention, silver metallic material of the solder ball attachment pads provide for leach resistance, improved adhesion, improved mechanical strength, simplifies the fabrication process, and reduces cost for improved connection of the solder balls to the LTCC substrate.

Other aspects and advantages of the invention will become more apparent from the following detailed description, taken in conjunction with the accompanying drawings, illustrating by way of example the present invention.

BRIEF DESCRIPTION OF THE DRAWINGS

The invention, together with further advantages thereof, may best be understood by reference to the following description taken in conjunction with the accompanying drawings in which:

FIG. 1F-2 shows a SEM image of the ball configured between the LTCC substrate and the PCB following a typical reflow operation sequence, in accordance with the prior art;

FIG. 1F-3 shows a SEM image of the LTCC ball attachment pad interface with the LTCC substrate following a typical reflow operation sequence, in accordance with the prior art;

FIG. 2 shows an LTCC substrate containing a via, in accordance with one embodiment of the present invention;

FIG. 3 shows a solder ball attachment pad disposed on the LTCC substrate, in accordance with one embodiment of the present invention;

DETAILED DESCRIPTION OF THE PREFERRED EMBODIMENTS

An invention is disclosed for apparatuses and methods for using Ag as a solder ball attachment pad to mechanically and electrically connected a BGA solder ball or flip chip solder ball to a ceramic body such as a Low Temperature Co-Fired Ceramic (LTCC) substrate. Broadly speaking, the present invention provides for using Ag as the solder ball attachment pad to minimize solder leaching of the solder ball attachment pad during a reflow operation, wherein severe leaching causes a delamination of the solder ball attachment pad from the ceramic body. Thus, the present invention eliminates the problems of the prior art by providing a Ag solder ball attachment pad that is leach resistant, adhesive, mechanically strong, simple to fabricate, and cost effective.

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

In the field of radio frequency (RF) and wireless applications, use of LTCC substrates are becoming more popular. LTCC substrates are capable of embedding passive components while providing superior performance at high frequencies. In this manner, LTCC substrates are generally attached to a printed circuit board (PCB), a number of semiconductor devices, or a number of discrete components, or a combination thereof, to define a larger electronic device. The LTCC substrates are commonly attached to the PCB using a ball grid array (BGA) attachment technique. Attachment of the semiconductor devices to the LTCC substrate can be accomplished by flip chip or wire bonding. The flip chip attachment produces superior RF performance relative to the wire bonding attachment.

Figure 1A:
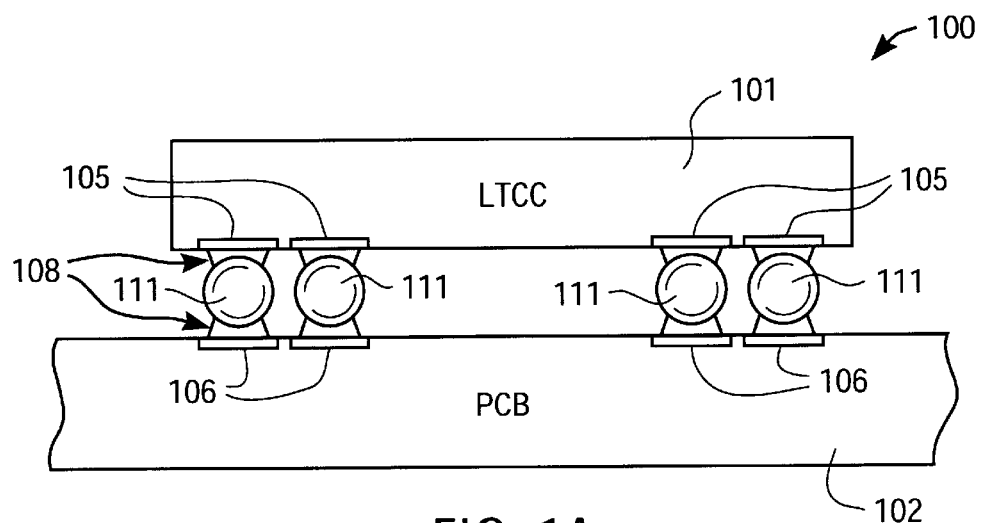
FIG. 1A shows an illustration of a BGA-to-PCB attachment configuration, in accordance with the prior art.
Figure 1B:
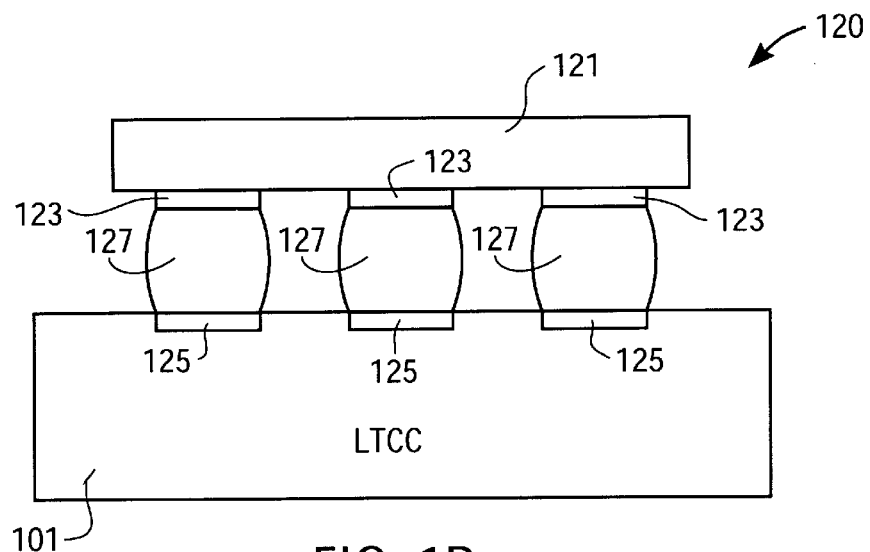
FIG. 1B shows an illustration of a flip chip attachment configuration, in accordance with the prior art.
Figure 1D:
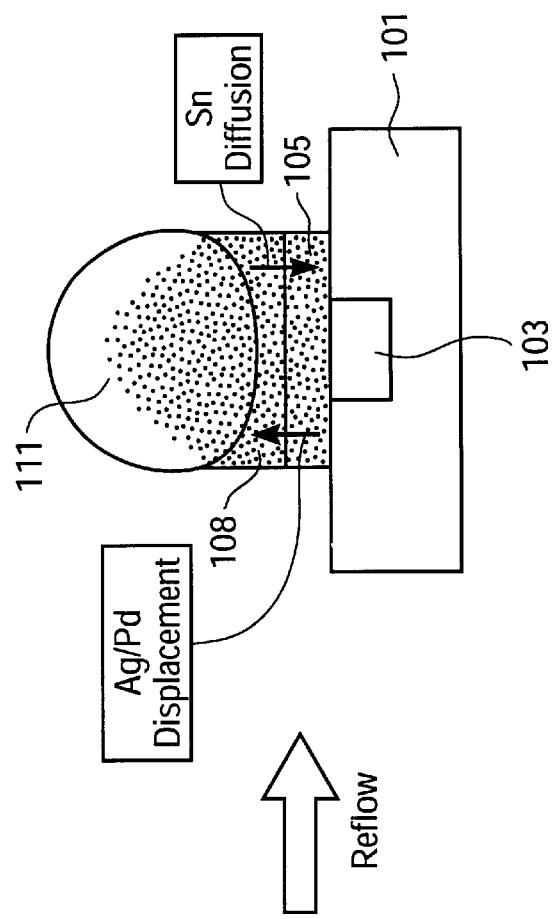
FIG. 1D shows an illustration of the BGA-to-PCB attachment configuration with respect to the LTCC substrate after a reflow operation, in accordance with the prior art.
Figure 1C:
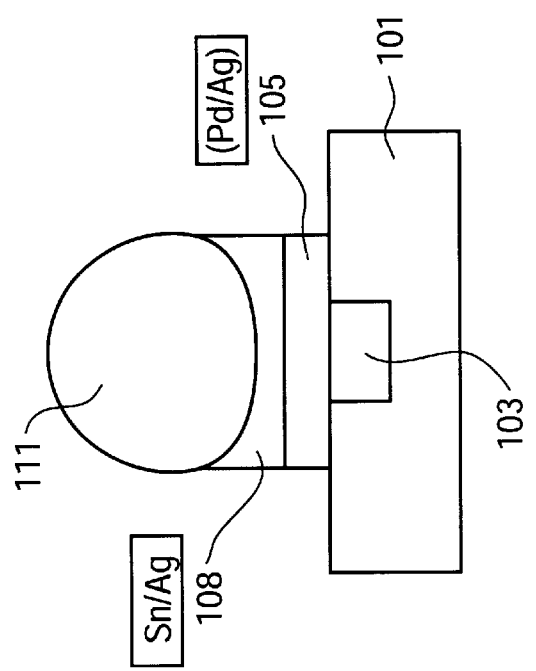
FIG. 1C shows an illustration of the BGA-to-PCB attachment configuration with respect to the LTCC substrate, in accordance with the prior art.
Figure 1E:
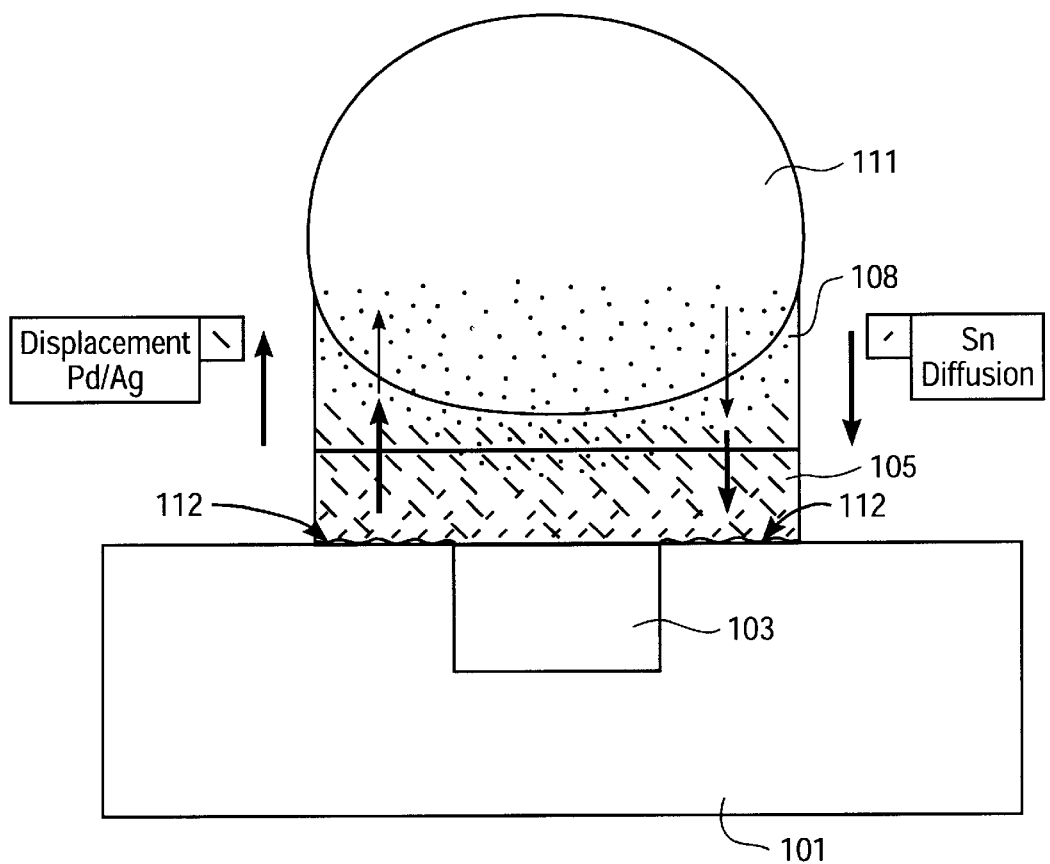
FIG. 1E shows an illustration of the Sn diffusion and resulting LTCC ball attachment pad delamination caused by the reflow operation, in accordance with the prior art.
Figures 1, 1F:
FIG. 1F-1 shows a scanning electron microscope (SEM) image of the BGA-to-PCB attachment configuration following a typical reflow operation sequence, in accordance with the prior art.
Figures 1, 1F, 2:
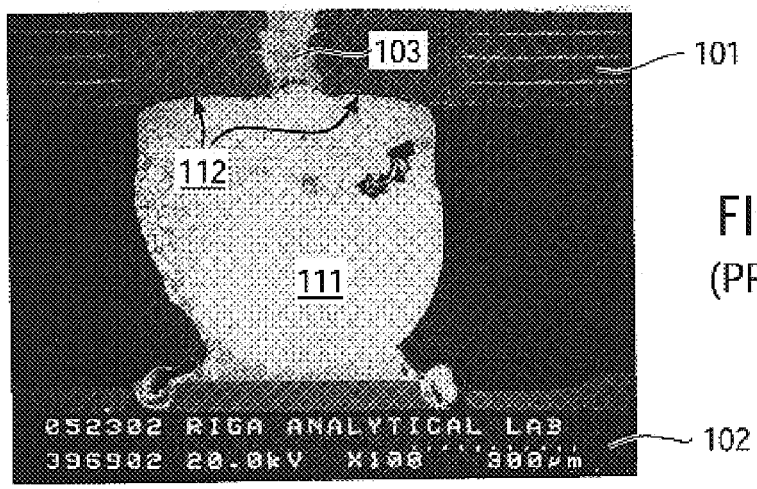

FIG. 2 shows an LTCC substrate 201 containing a via 203, in accordance with one embodiment of the present invention. The via 203 material is exposed to a solder ball attachment side 202 of the LTCC substrate 201. The via 203 material is either Ag or a Ag/palladium (Pd) mixture. The via 203 is used to electrically connected embedded components within the LTCC substrate to either the PCB using the BGA attachment technique or the semiconductor device using the flip chip attachment technique.

Figures 1, 1F, 2, 3:
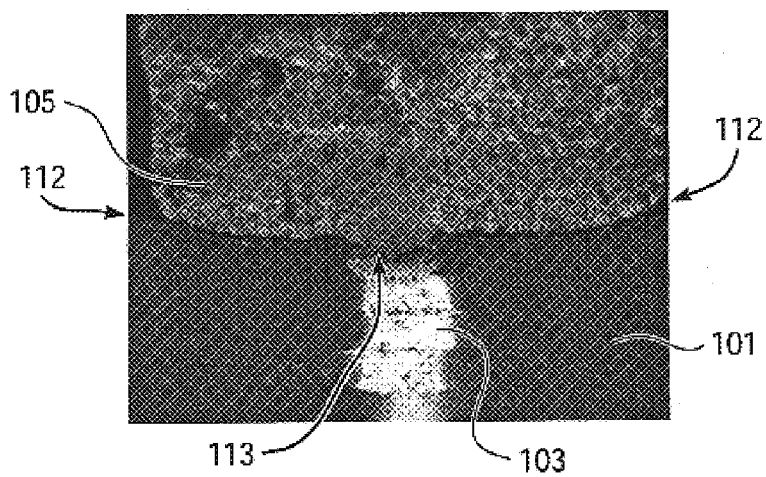
Figure 2:
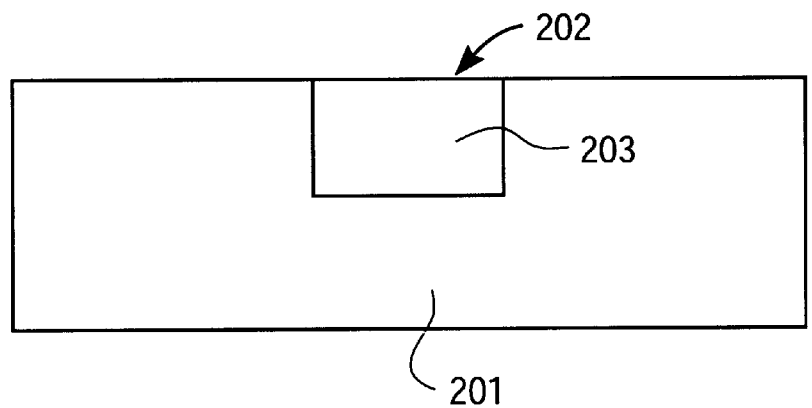
Figure 3:
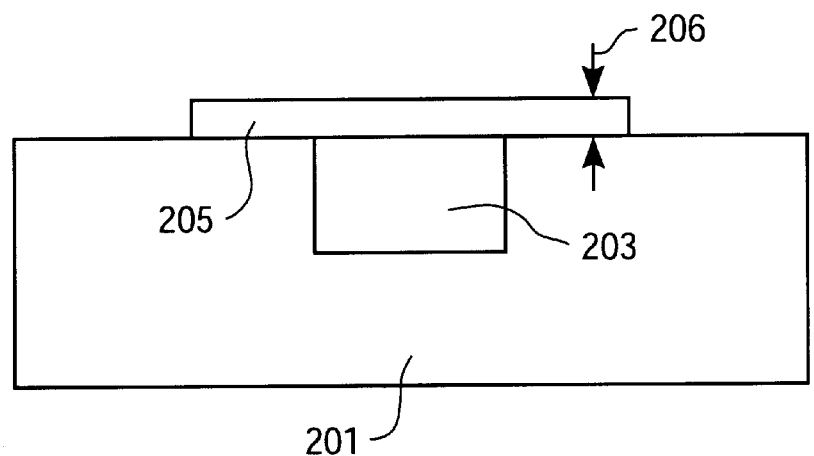

FIG. 3 shows a solder ball attachment pad 205 disposed on the LTCC substrate 201, in accordance with one embodiment of the present invention. The solder ball attachment pad 205 is configured to cover the via 203. The solder ball attachment pad 205 can be composed of Ag alone or Ag mixed with one or more bonding agents such as glass, oxide, or adhesive. However, the only metal present in the solder ball attachment pad 205 is Ag. In a preferred embodiment, the solder ball attachment pad 205 has a thickness 206 of about 20 micrometers ($\mu$m or microns). In alternate embodiments, the solder ball attachment pad 205 thickness 206 is within a range extending from about 5 μm to about 50 μm, but more preferably in a range extending from about 8 μm to about 30 μm.

Figure 4:
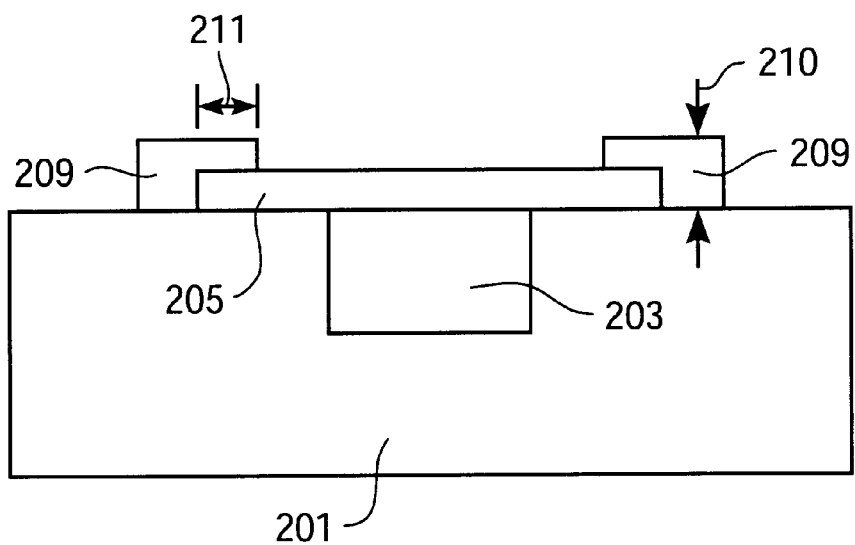
FIG. 4 shows a glass anchor disposed around a periphery of the solder ball attachment pad, in accordance with one embodiment of the present invention.

FIG. 4 shows a glass anchor 209 disposed around a periphery of the solder ball attachment pad 205, in accordance with one embodiment of the present invention. The glass anchor 209 is provided to reinforce the LTCC substrate 201 underneath the solder ball attachment pad 205 and around the via 203. The reinforcement provided by the glass anchor 209 prevents the LTCC substrate 201 from fracturing when subjected to a shear stress provided along a plane tangent to the solder ball attachment pad 205 interface with the LTCC substrate 201. In one embodiment, the glass anchor 209 has a thickness 210 within a range extending from about 5% to about 100% of the thickness 206 of the solder ball attachment pad 205. In a preferred embodiment, the glass anchor 209 thickness 210 is within a range extending from about 25% to about 50% of the thickness 206 of the solder ball attachment pad 205. Also in a preferred embodiment, the glass anchor 209 overlaps the periphery of the solder ball attachment pad 205 by a distance 211 within a range extending from about 5% to about 30% of a radius of the solder ball attachment pad 205.

Figure 5:
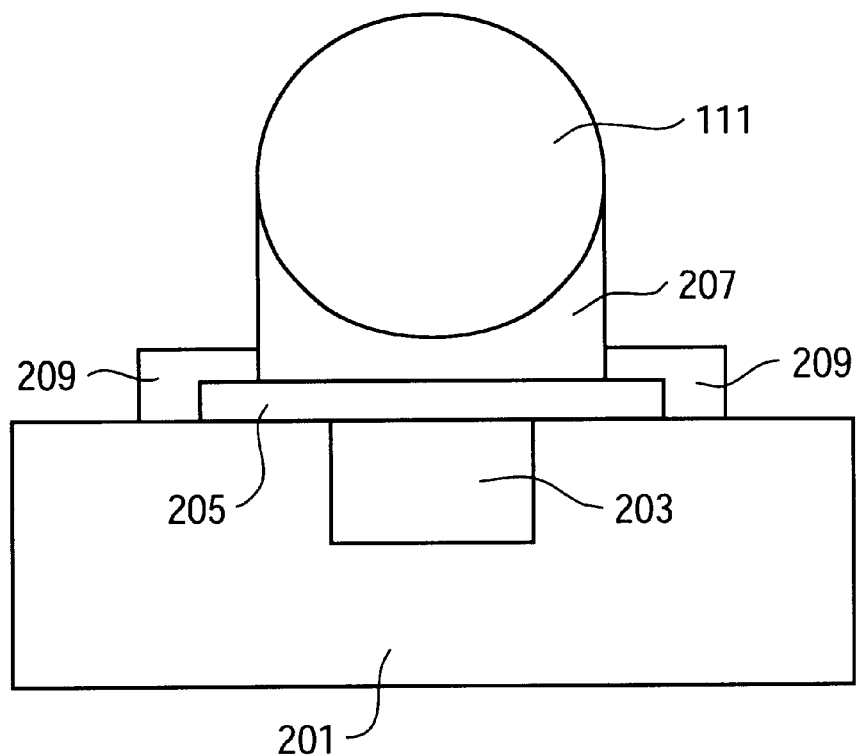
FIG. 5 shows a solder and a solder ball disposed on the solder ball attachment pad, in accordance with one embodiment of the present invention.

FIG. 5 shows a solder 207 and a solder ball 111 disposed on the solder ball attachment pad 205, in accordance with one embodiment of the present invention. The solder 207 is disposed on the solder ball attachment pad 205 surface opposite the LTCC substrate 201. In a preferred embodiment, the solder 207 completely covers an area of the solder ball attachment pad 205 radially defined by the glass anchor 209. The solder 207 is initially applied to the solder ball attachment pad 205 in the form of a solder paste. Thereafter, a solder reflow process is performed wherein the solder paste becomes the solder 207. In a preferred embodiment, the solder paste is applied with a thickness within a range extending from about 0.006 inch to about 0.007 inch. However, alternate embodiments can use a different solder paste thickness. The required solder paste thickness is generally dependent on a design specific solder paste volume requirement. The solder ball 111 is disposed within the solder paste opposite the solder ball attachment pad 205. In this manner, the solder ball 111 is in electrical communication with the via 203 after the solder reflow process.

In a preferred embodiment, the solder ball 111 is composed of a Pb/Sn mixture, wherein the Pb percentage in the mixture is within a range extending from about 80% to about 95%. In alternate embodiments, other electrically conductive solder ball 111 materials can be used. One example of an alternate solder ball 111 material is a eutectic solder composed of about 63% Sn and about 37% Pb. Other examples of alternative solder ball 111 materials include balls having a solder coating over a core consisting of copper (Cu), Ag, or polymers.

In a preferred embodiment, the solder 207 composition contains about 63% tin (Sn) and about 37% lead (Pb). The 63% Sn/37% Pb solder 207 composition allows the reflow operation to be performed at a peak temperature of about 205° C. with a time to peak temperature of about 180 seconds. A common solder 207 composition of about 96.5% Sn and about 3.5% Ag requires the reflow operation to be performed at a peak temperature of about 240° C. with a time to peak temperature of about 360 seconds. Thus, the 63% Sn/37% Pb solder 207 composition not only reduces the peak reflow temperature by 35° C., but also reduces the reflow operation time by half. It is not required, however, that the 63% Sn/37% Pb composition be used for the solder 207. In alternate embodiments, other solder 207 compositions can be used as long as the composition is compatible with the solder ball 111 and solder ball attachment pad 205 materials. Examples of solder 207 compositions used in alternate embodiments may include the common 96.5% Sn/3.5% Ag composition or a composition containing about 62% Sn, about 36% Pb, and about 2% Ag.

Figure 6A:
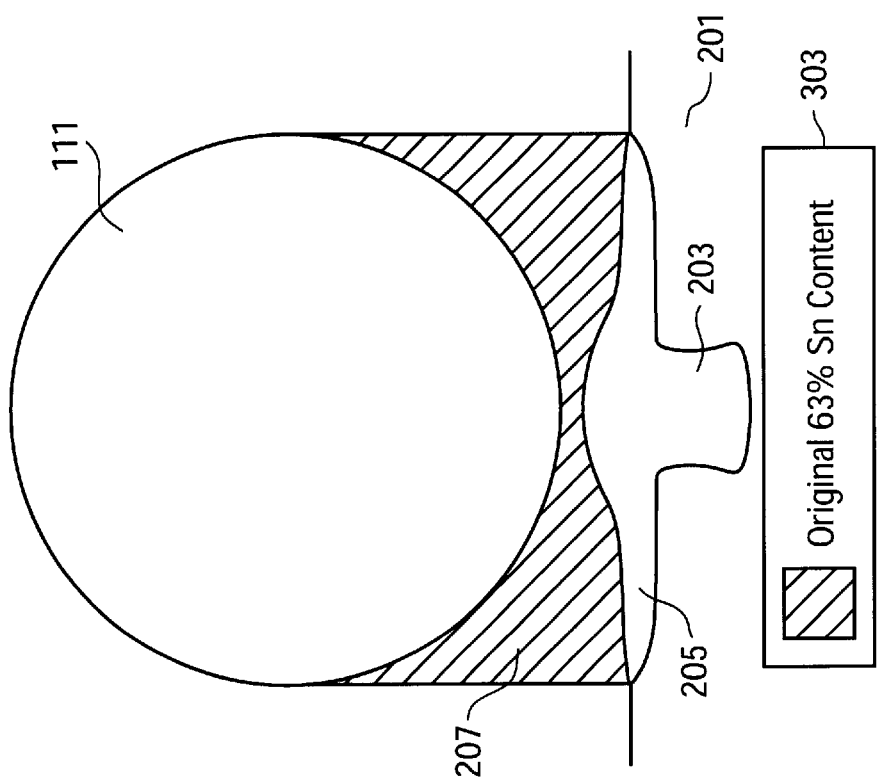
FIG. 6A shows an illustration of the Ag content in both the solder and the solder ball attachment pad after three reflow operations, in accordance with a preferred embodiment of the present invention.

FIG. 6A shows an illustration of the Ag content in both the solder 207 and the solder ball attachment pad 205 after three reflow operations, in accordance with a preferred embodiment of the present invention. As indicated in a box 301, the Ag content of the solder 207 remains essentially unchanged at about 0%. Also, the Ag content of the solder ball attachment pad 205 remains essentially unchanged at about 100%. The essentially unchanged Ag content of both the solder 207 and the solder ball attachment pad 205 indicates that very little Sn diffusion occurs during the reflow operation.

Figure 6B:
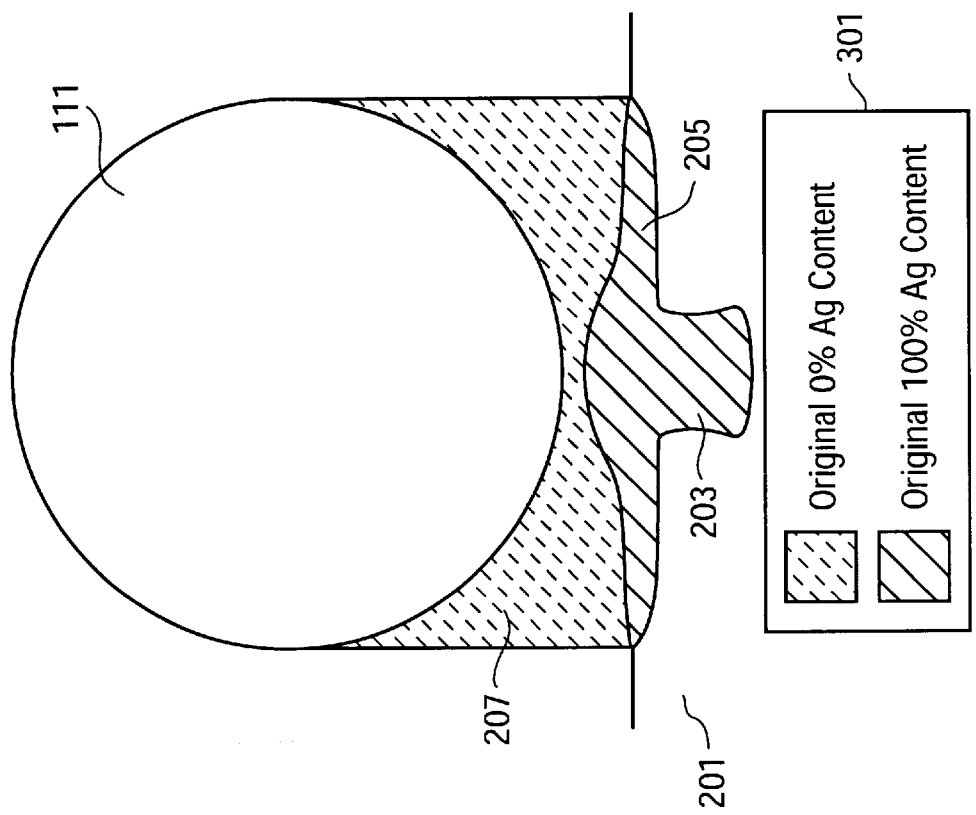
FIG. 6B shows an illustration of the Sn content in the solder after three reflow operations, in accordance with a preferred embodiment of the present invention.

FIG. 6B shows an illustration of the Sn content in the solder 207 after three reflow operations, in accordance with a preferred embodiment of the present invention. As indicated in a box 303, the Sn content in the solder 207 remains essentially unchanged at about 63%. A Sn diffusion layer thickness ranging from about 3 μm to about 5 μm is detected after the three reflow operations. The Sn diffusion layer resides at an interface between the solder 207 and the solder ball attachment pad 205. In a preferred embodiment of the present invention, the solder ball attachment pad 205 thickness is about 20 μm. Normally, a solder ball attachment pad 205 thickness of at least 10 μm remains between the Sn diffusion layer and the LTCC substrate 201 after three reflow operations. Thus, Sn diffusion does not cause the solder ball attachment pad 205 of the present invention to delaminate from the LTCC substrate 201. In comparison, the Pd/Ag solder ball attachment pad 205 of the prior art has a Sn diffusion layer that penetrates the entire thickness of the solder ball attachment pad 205 after only two reflow operations. Consequently, the Pd/Ag solder ball attachment pad of the prior art suffers delamination from the LTCC substrate 201.

Figure 7A:
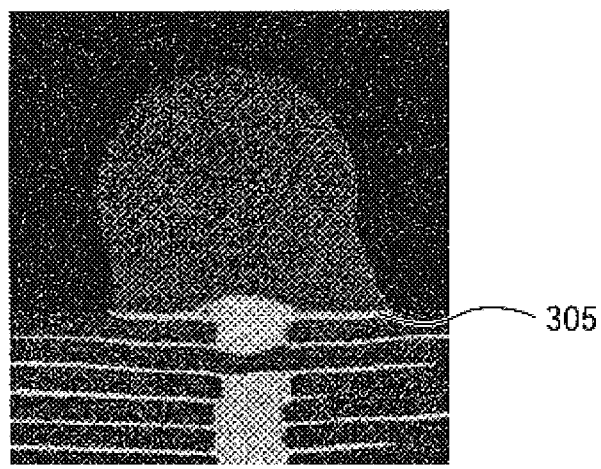
FIG. 7A shows a scanning electron microscope (SEM) energy dispersive x-ray (EDX) Ag dot map image of the solder ball attachment pad following a first reflow operation, in accordance with a preferred embodiment of the present invention.

FIG. 7A shows a scanning electron microscope (SEM) energy dispersive x-ray (EDX) Ag dot map image of the solder ball attachment pad 305 following a first reflow operation, in accordance with a preferred embodiment of the present invention. After the first reflow operation there are no indications of Ag displacement into the solder 207 or solder ball attachment pad 305 delamination.

Figure 7B:
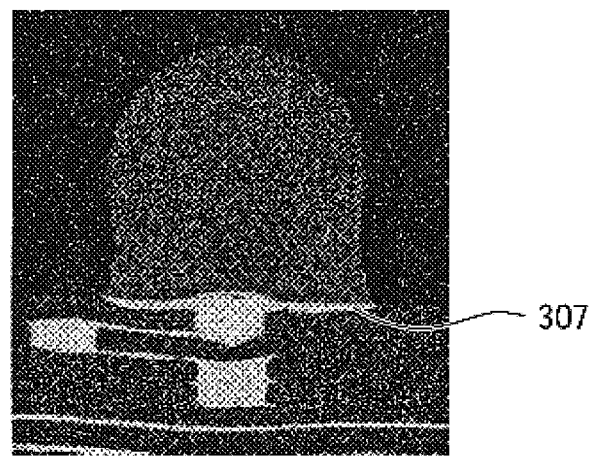
FIG. 7B shows a SEM EDX Ag dot map image of the solder ball attachment pad following a second reflow operation, in accordance with a preferred embodiment of the present invention.

FIG. 7B shows a SEM EDX Ag dot map image of the solder ball attachment pad 307 following a second reflow operation, in accordance with a preferred embodiment of the present invention. After the second reflow operation there are still no indications of Ag displacement into the solder 207 or solder ball attachment pad 305 delamination.

Figure 7C:
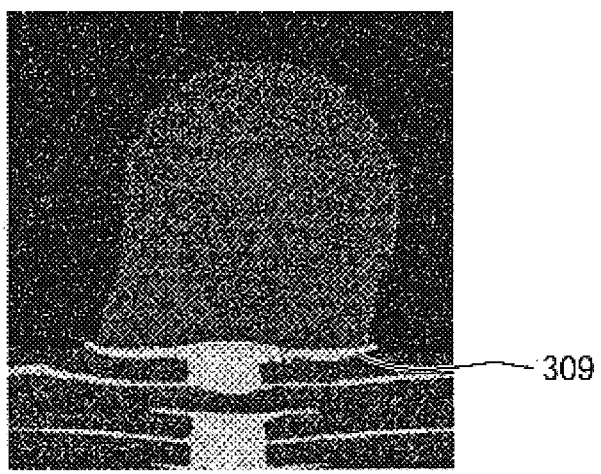
FIG. 7C shows a SEM EDX Ag dot map image of the solder ball attachment pad following a third reflow operation, in accordance with a preferred embodiment of the present invention.

FIG. 7C shows a SEM EDX Ag dot map image of the solder ball attachment pad 309 following a third reflow operation, in accordance with a preferred embodiment of the present invention. Even after the third reflow operation there are still no indications of Ag displacement into the solder 207 or solder ball attachment pad 305 delamination.

Figure 7D:
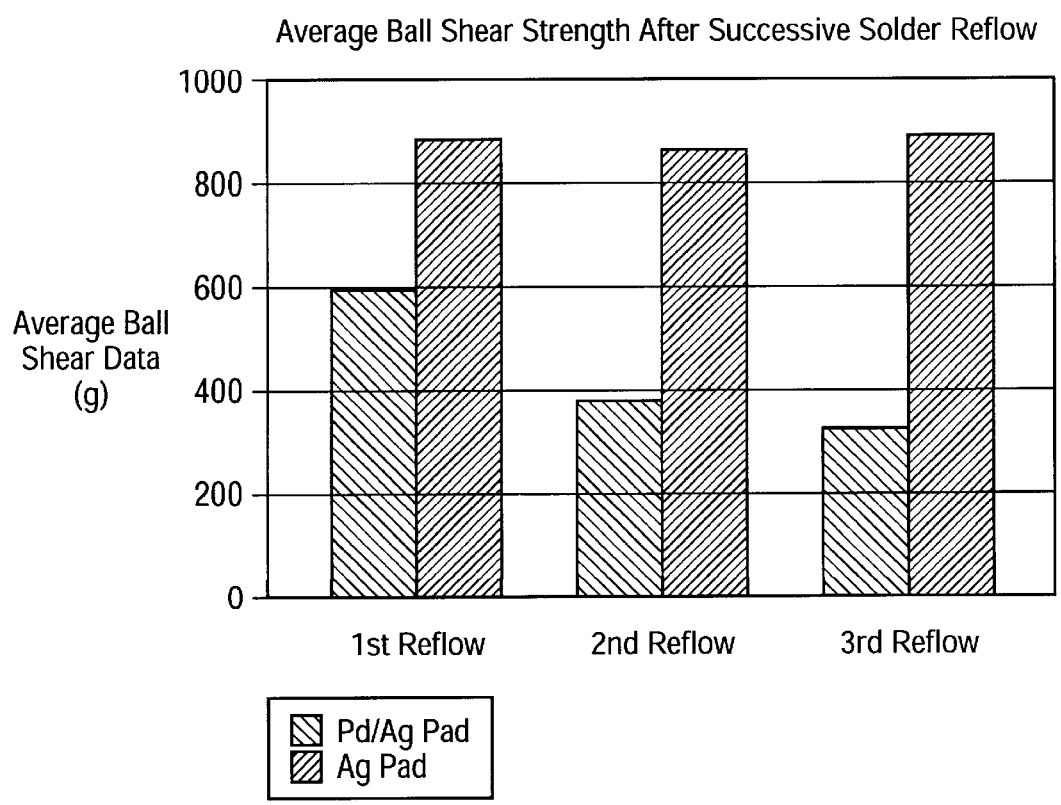
FIG. 7D shows a chart of the average solder ball shear strength after the first, second, and third reflow operations, in accordance with a preferred embodiment of the present invention.

FIG. 7D shows a chart of the average solder ball 111 shear strength after the first, second, and third reflow operations, in accordance with a preferred embodiment of the present invention. The Ag solder ball attachment pad of the present invention maintains a substantially constant average shear strength during the three reflow operations. After the first reflow operation, the Pd/Ag solder ball attachment pad of the prior art has a shear strength that is about 290 grams less than that of the Ag solder ball attachment pad of the present invention. Furthermore, after the third reflow operation, the Pd/Ag solder ball attachment pad of the prior art has a shear strength that is about 576 grams less than that of the Ag solder ball attachment pad of the present invention.

Figure 8A:
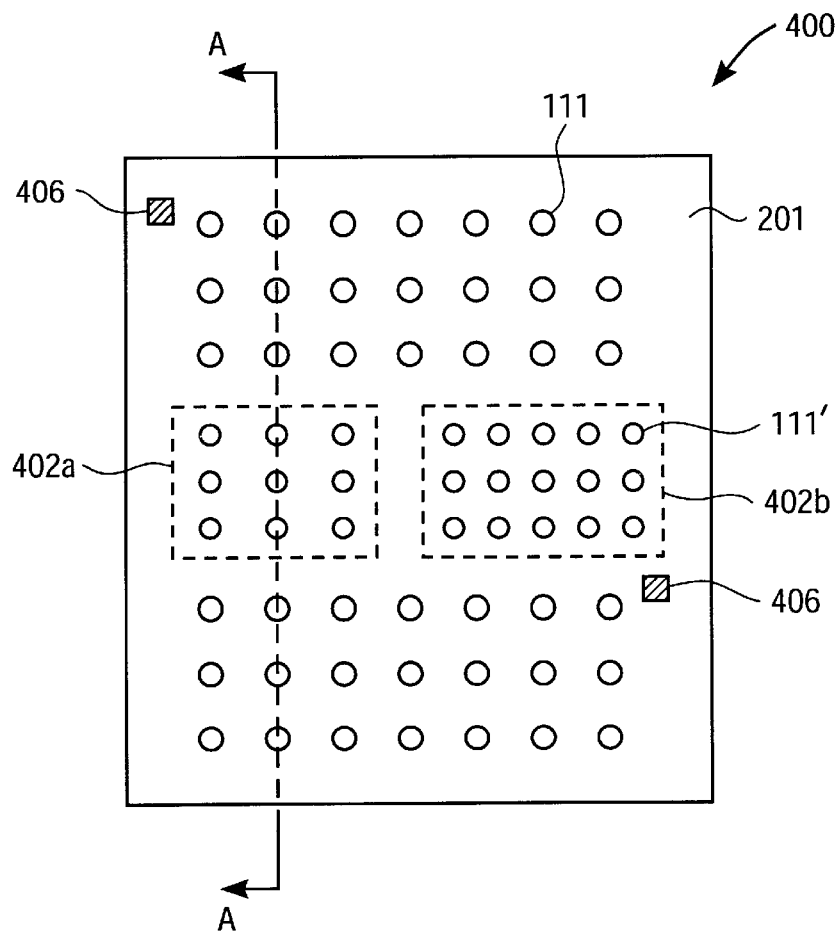
FIG. 8A shows an illustration of an exemplary LTCC package having a BGA configured to receive both a PCB and a plurality of flip chip devices, in accordance with one embodiment of the present invention.

FIG. 8A shows an illustration of an exemplary LTCC package 400 having a BGA configured to receive both a PCB 102 and a plurality of flip chip devices, in accordance with one embodiment of the present invention. The exemplary LTCC package 400 is shown to include the LTCC substrate 201 having a BGA configuration and a flip chip configuration. The BGA configuration containing the solder ball 111 is configured to attach to a PCB 102. The flip chip configuration containing a solder ball 111' is configured to attach to a die. The die is shown to be either a flip chip 402a or a flip chip 402b. Fiducials 406 are also shown on the LTCC package 400. The fiducials 406 are used to align a device (not shown) which places the solder paste and solder balls 111 on the LTCC substrate 201. With the exemplary LTCC package 400, a single reflow operation is used to perform both the solder ball 111 attachments and the flip chip (402a and 402b) attachments. The single reflow operation simplifies fabrication and reduces overall device cost. It should be appreciated by those skilled in the art that the exemplary LTCC package 400, including the BGA configuration and the flip chip configuration, is an arbitrary example that can be modified without regard to the present invention.

Figure 8B:
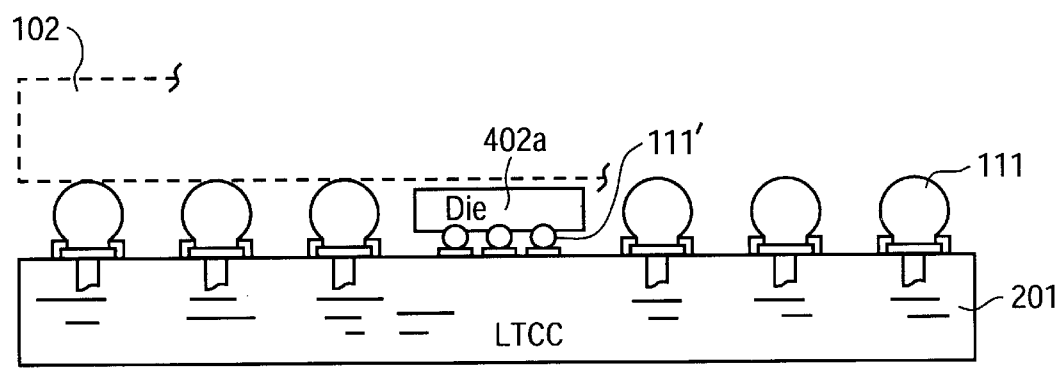
FIG. 8B shows a side view of the exemplary LTCC package corresponding to a cross-sectional view A—A in FIG. 8A, in accordance with one embodiment of the present invention.

FIG. 8B shows a side view of the exemplary LTCC package 400 corresponding to a cross-sectional view A—A in FIG. 8A, in accordance with one embodiment of the present invention. The LTCC package 400 is configured such that the flip chip 402a (and 402b not shown) is first attached to the LTCC substrate 201. The PCB 102 is then placed over the flip chips 402a and 402b for attachment to the LTCC substrate 201.

Figure 8C:
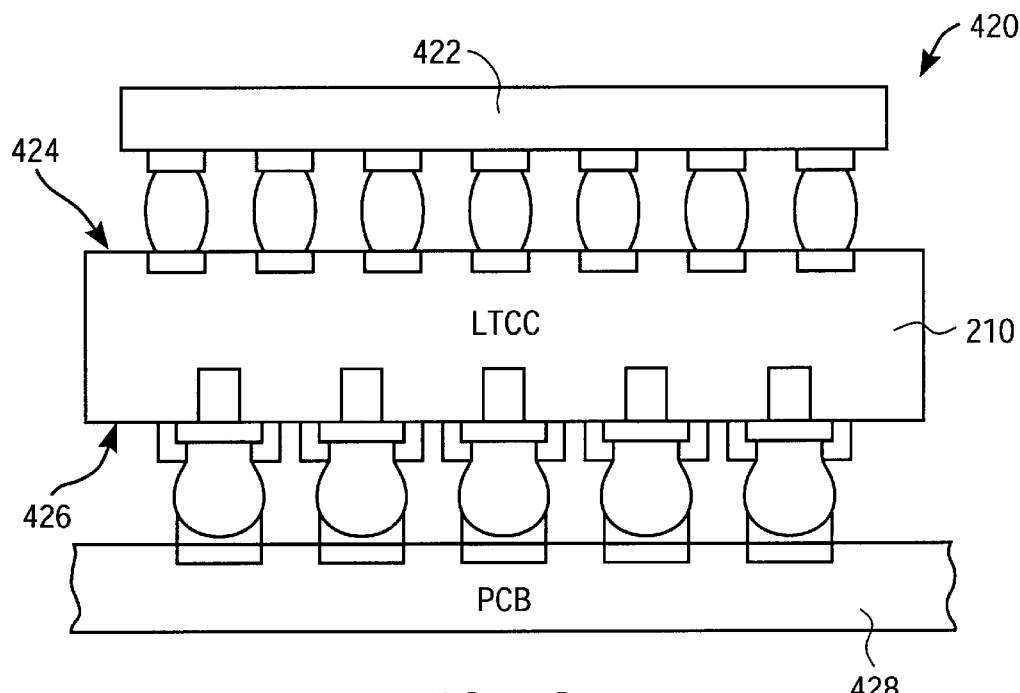
FIG. 8C shows an illustration of an exemplary LTCC package configured to receive both a PCB and a flip chip, in accordance with one embodiment of the present invention.

FIG. 8C shows an illustration of an exemplary LTCC package 420 configured to receive both a PCB 428 and a flip chip 422, in accordance with one embodiment of the present invention. The LTCC package 420 is configured to have the flip chip 422 and PCB 428 attached to opposing sides 424 and 426, respectively, of the LTCC substrate 201.

Figure 9:
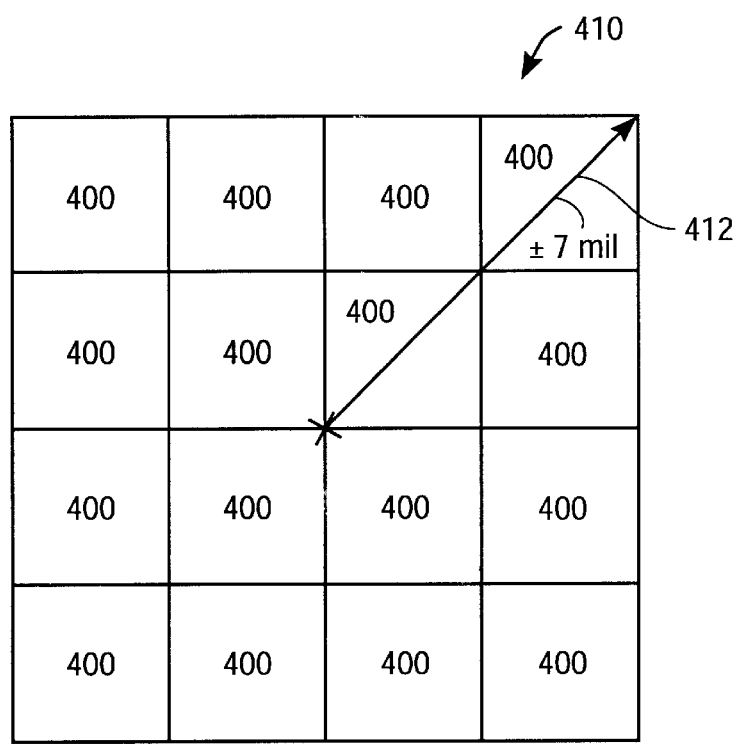
FIG. 9 shows an illustration of an LTCC package array, in accordance with one embodiment of the present invention.

FIG. 9 shows an illustration of an LTCC package array 410, in accordance with one embodiment of the present invention. The LTCC package array 410 includes a four-by-four array of LTCC packages 400. Typically, a distance 412 from a center to a corner of the LTCC package array 410 has a tolerance of ±0.007 inch. Due to this tolerance, the LTCC package array 410 can be slightly trapezoidal in shape. The LTCC package array 410 having a trapezoidal shape causes an array of solder ball attachment pads to be slightly off-square. Both the solder paste and the solder balls 111 are deposited according to an absolute square grid. Therefore, with the LTCC package array 410 having an off-square array, a center-to-center offset can exist between the deposited solder paste/solder ball 111 and the associated solder ball attachment pad 205. The center-to-center offset can be as high as 50% of the solder ball attachment pad 205 diameter. The present invention has a beneficial feature in that during the reflow operation, the Ag contained within the solder ball attachment pad 205 expresses superior wetting characteristics, relative to the Ag/Pd composition of the prior art, and causes the solder paste and solder ball 111 to self-center on the solder ball attachment pad 205. This self-centering feature provides for lower LTCC package 400 defect rates during fabrication.

It is known that Ag has a tendency to migrate on the surface of the LTCC substrate 201 when subjected to high humidity and voltage bias. The present invention uses a complete passivation layer to cover the solder ball attachment pad 205, thus preventing Ag migration. In a preferred embodiment, the complete passivation layer is provided by the solder 207. Specifically, the solder 207 covers the entire exposed area of the solder ball attachment pad 205 radially defined by the glass anchor 209. In alternate embodiments, a co-fired glass layer or a post-fire layer such as epoxy can be used to passivate exposed edges of the solder ball attachment pad 205. In addition to Ag migration prevention, a properly applied passivation layer can also serve to reduce stress in both the solder ball attachment pad 205 and LTCC substrate 201 near the periphery of the solder ball attachment pad 205.

Figure 10:
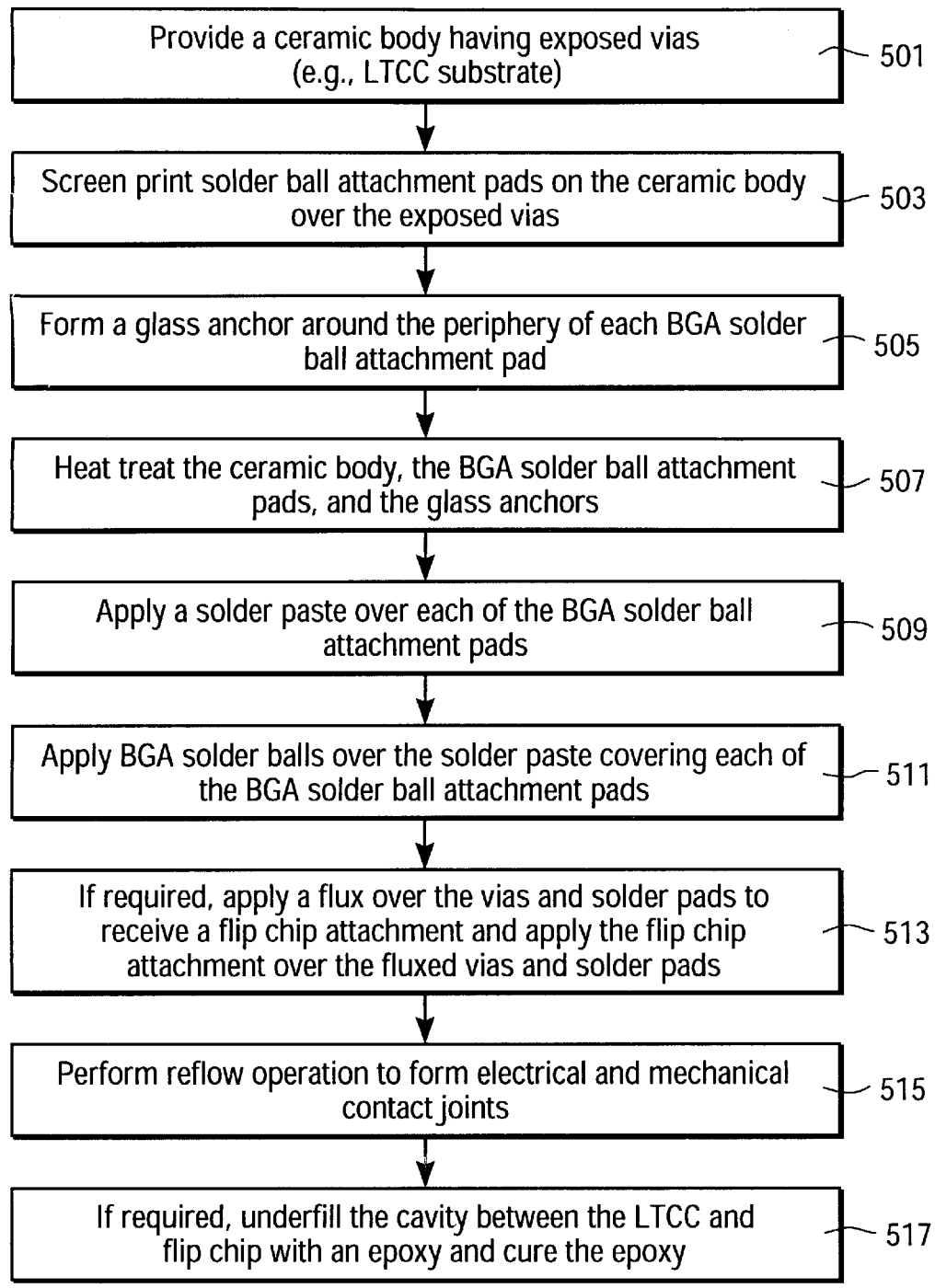
FIG. 10 shows a flowchart illustrating a method for making a semiconductor package, in accordance with one embodiment of the present invention.

FIG. 10 shows a flowchart illustrating a method for making a semiconductor package, in accordance with one embodiment of the present invention. The method begins with a step 501 in which a ceramic body (e.g., LTCC substrate) containing a plurality of metallic interconnect layers and vias is provided. The ceramic body is configured to have a solder ball attachment side containing an exposed portion of the plurality of vias. The method includes a step 503 in which a plurality of solder ball attachment pads are screen printed onto the solder ball attachment side of the ceramic body to cover the plurality of exposed vias, except those designated for direct via attachment of flip chips. The plurality of solder ball attachment pads are composed of material with a metallic content limited to Ag. A step 505 includes forming a glass anchor around a periphery of each BGA solder ball attachment pad. The glass anchor is formed to overlap at least a portion of the outer periphery of the BGA solder ball attachment pad. The glass anchor provides mechanical support to offset stresses at an interface between the BGA solder ball attachment pad and the ceramic body. A step 507 is performed in which the ceramic body, the solder ball attachment pads, and the glass anchors are heat treated during the co-fire process that causes the LTCC substrate to sinter. The method further includes a step 509 in which a solder paste is applied over each of the plurality of BGA solder ball attachment pads. In a step 511, solder balls are applied over the solder paste previously applied over the plurality of BGA solder ball attachment pads. If required by the device design, a step 513 is performed in which a flux is applied over solder pads and vias for a flip chip attachment. Also in step 513, the flip chip with pre-deposited solder bumps is applied over the vias and solder pads covered with the flux. In a step 515, a reflow operation is performed to reflow the solder paste, the solder balls, and the solder bumps to form electrical and mechanical contact joints. The reflow operation causes the solder balls and solder bumps to self-center over their respective solder ball attachment pads or vias. The method concludes with a step 517 in which an underfill epoxy material is injected into the cavity between the flip chip and the LTCC substrate and thermally cured to provide enhanced field use reliability.

In view of the foregoing, use of Ag (or Ag in combination with one or more bonding agents) for the solder ball attachment pad 205 solves the problems of the prior art with respect to reliably attaching the BGA solder ball 111 to the LTCC substrate 201. The solder ball attachment pad 205 of the present invention provides resistance to leaching of Sn from the solder 207 into the solder ball attachment pad 205. Furthermore, the Sn leaching resistance of the present invention prevents intrusion of Sn into the interface between the solder ball attachment pad 205 and the LTCC substrate 201. By preventing intrusion of Sn into the interface, delamination of the solder ball attachment pad 205 from the LTCC substrate 201 is prevented, thus ensuring continued reliable adhesion between the solder ball attachment pad 205 and LTCC substrate 201. Use of the glass anchor 209 in combination with the solder ball attachment pad 205 provides excellent strength characteristics to improve product reliability. Additionally, use of simple fabrication processes and relatively inexpensive materials by the present invention provides a cost effective solution to the problems of the prior art.

While this invention has been described in terms of several embodiments, it will be appreciated that those skilled in the art upon reading the preceding specifications and studying the drawings will realize various alterations, additions, permutations and equivalents thereof. It is therefore intended that the present invention includes all such alterations, additions, permutations, and equivalents as fall within the true spirit and scope of the invention.

What is claimed is:

1. A semiconductor ceramic package, comprising:
   a ceramic body defined by a plurality of conductive interconnect layers, the ceramic body including at least one solder ball attach side;
   a plurality of solder ball attach pads defined on the at least one solder ball attach side of the ceramic body, each of the solder ball attach pads being in contact with a conductive via that is in electrical communication with one of the plurality of conductive interconnect layers, each solder ball attach pad including metal content that is limited to silver metal; and
   a plurality of glass anchors, each glass anchor being configured to surround and overlap a periphery of each of the solder ball attach pads.

2. A semiconductor ceramic package as recited in claim 1, further comprising:
   solder paste being defined over each of the plurality of solder ball attach pads, each glass anchor serving to contain the solder paste over a center portion of each of the plurality of solder ball attach pads.

3. A semiconductor ceramic package as recited in claim 2, further comprising:
   a plurality of solder balls being defined over the solder paste of each of the solder ball attach pads, the plurality of solder paste and solder balls being subjected to a reflow process to attach the plurality of solder balls to the solder ball attach pads.

4. A semiconductor ceramic package as recited in claim 1, wherein the metal content that is limited to silver metal of each of the solder ball pads further includes one or more bonding agents.

5. A semiconductor ceramic package as recited in claim 4, wherein the bonding agents are selected from the group consisting of glass, oxides, and adhesives.

6. A semiconductor ceramic package as recited in claim 3, wherein each of the plurality of solder balls is composed of a Pb/Sn mixture.

7. A semiconductor ceramic package as recited in claim 3, wherein each of the plurality of solder balls is composed of a Pb/Sn coating over a core material.

8. A semiconductor ceramic package as recited in claim 2, wherein the solder paste is composed of a Pb/Sn mixture.

9. A semiconductor ceramic package as recited in claim 2, wherein the solder paste is composed of a Sn/Ag mixture.

10. A semiconductor ceramic package as recited in claim 1, wherein the solder ball attach pads have a thickness varying between about 5 microns and about 50 microns.

11. A semiconductor ceramic package as recited in claim 1, wherein the solder ball attach pads have a thickness varying between about 8 microns and about 30 microns.

12. A semiconductor ceramic package as recited in claim 1, wherein each of the plurality of glass anchors overlaps the solder ball attach pads at the periphery, the overlap ranges between about 5% and about 30.

13. A semiconductor ceramic package as recited in claim 1, wherein the plurality of glass anchors provide mechanical reinforcement at a high stress interface that is between the ceramic body and each of the solder ball attach pads.

14. A semiconductor ceramic package as recited in claim 1, wherein the conductive via includes one of a metal limited to silver and a metal mixture of silver and palladium.

15. A semiconductor ceramic package as recited in claim 1, wherein the ceramic body is a low temperature co-fired ceramic.

16. A semiconductor ceramic package as recited in claim 1, wherein the semiconductor ceramic package is configured to receive at least one flip chip, the at least one flip chip being attached by solder to the solder ball attach pads or vias of the ceramic body.

17. A semiconductor ceramic package as recited in claim 1, wherein the semiconductor ceramic package is configured to be attached to by solder and solder balls, which are attached to the solder ball attach pads of the ceramic body, to a printed circuit board (PCB).

18. A package, comprising:
    a low temperature co-fired ceramic body including by a plurality of conductive interconnect layers, the low temperature co-fired ceramic body including at least one solder ball attach side,
    a plurality of solder ball attach pads defined on the at least one solder ball attach side of the low temperature co-fired ceramic body, each of the solder ball attach pads being in contact with a conductive via that is in electrical communication with at least one of the plurality of conductive interconnect layers, each solder ball attach pad having metallic content that is limited to silver.

19. A package as recited in claim 18, further comprising:
    a plurality of glass anchors, each glass anchor being configured to surround and overlap an outer periphery of a number of the solder ball attach pads.

20. A package as recited in claim 18, further comprising:
    solder paste being defined over each of the plurality of solder ball attach pads, each glass anchor serving to increase strength of an interface between the solder ball attach pads and the low temperature co-fired ceramic body.

21. A package as recited in claim 20, wherein each glass anchor further serves to contain the solder paste over a center portion of each of the plurality of solder ball attach pads.

22. A package as recited in claim 20, further comprising:
    a plurality of solder balls being defined over the solder paste of each of the solder ball attach pads, the plurality of solder paste and solder balls being subjected to a reflow process to attach the plurality of solder balls to the solder ball attach pads.

23. A package as recited in claim 18, wherein the metallic content that is limited to silver for each of the solder ball attach pads further includes one or more bonding agents.

24. A package as recited in claim 23, wherein the bonding agents are selected from the group consisting of glass, oxides, and adhesives.

25. A package as recited in claim 22, wherein each of the plurality of solder balls is composed of a Pb/Sn mixture.

26. A package as recited in claim 20, wherein the solder paste is composed of a Sn/Ag mixture.

27. A method for making a semiconductor package, comprising:

providing a ceramic body including a plurality of metallic interconnect layers, the ceramic body having at least one solder ball attach side and a plurality of conductive vias;

screen printing a solder ball attach pad over selected ones of the conductive vias, the solder ball attach pad being defined from metallic content that is limited to silver; and forming a glass anchor around an outer periphery of a number of the solder ball attach pads, the glass anchor overlapping at least a portion of the outer periphery and partially defined over the ceramic body, the glass anchor providing mechanical support to offset stress fractures at an interface between the solder ball attach pads and the ceramic body.

28. A method for making a semiconductor package as recited in claim 27, further comprising:

heat treating the ceramic body including the screen printed solder ball attach pads and the glass anchors.

29. A method for making a semiconductor package as recited in claim 27, further comprising:

applying a solder paste over a number of the solder ball attach pads.

30. A method for making a semiconductor package as recited in claim 29, further comprising:

applying solder balls over the solder paste.

31. A method for making a semiconductor package as recited in claim 27, further comprising:

applying a flux over the solder ball attach pads and vias to receive a flip chip attachment.

32. A method for making a semiconductor package as recited in claim 31, further comprising:

applying a flip chip over the fluxed solder ball attach pads and vias.

33. A method for making a semiconductor package as recited in claim 30, further comprising:

reflowing the solder paste and solder balls, the reflowing causing a self-centering of the solder balls over the solder ball attach pads.

* * * * *